(12) United States Patent
Mizutani et al.

(10) Patent No.: US 9,329,505 B2
(45) Date of Patent: May 3, 2016

(54) LITHOGRAPHY SYSTEM AND MANUFACTURING METHOD OF COMMODITIES

(75) Inventors: Fumiaki Mizutani, Utsunomiya (JP); Yutaka Watanabe, Shioya-gun (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 679 days.

(21) Appl. No.: 13/595,033

(22) Filed: Aug. 27, 2012

(65) Prior Publication Data

US 2013/0057839 A1    Mar. 7, 2013

(30) Foreign Application Priority Data

Sep. 5, 2011    (JP) .................................. 2011-193277

(51) Int. Cl.
  *G03B 27/58*    (2006.01)
  *G03F 9/00*    (2006.01)
  *G03F 7/20*    (2006.01)

(52) U.S. Cl.
  CPC .............. *G03F 9/7096* (2013.01); *G03F 7/709* (2013.01); *G03F 7/70991* (2013.01); *G03F 9/7038* (2013.01)

(58) Field of Classification Search
  CPC . G03F 7/709; G03F 7/70991; G03F 7/70833; G03F 7/70825; G03F 7/70525; G03F 7/70725; G03F 7/70775; G03F 7/70716; G03F 7/70766; G03F 7/704; H01J 2237/0216; G02B 27/646
  USPC .......................................................... 355/53
  See application file for complete search history.

(56) References Cited

U.S. PATENT DOCUMENTS

| | | | |
|---|---|---|---|
| 5,504,407 A * | 4/1996 | Wakui et al. | ............. 318/568.17 |
| 7,327,437 B2 | 2/2008 | Cox et al. | |
| 8,553,199 B2 | 10/2013 | Butler et al. | |

(Continued)

FOREIGN PATENT DOCUMENTS

| | | |
|---|---|---|
| JP | 5-234865 A | 9/1993 |
| JP | 9219361 A | 8/1997 |

(Continued)

OTHER PUBLICATIONS

Japanese Office Action issued in Japanese counterpart application No. JP2011193277, dated Aug. 3, 2015.

(Continued)

*Primary Examiner* — Mesfin T Asfaw
(74) *Attorney, Agent, or Firm* — Rossi, Kimms & McDowell LLP (57) ABSTRACT

The present invention provides a lithography system including an obtaining unit which obtains a transfer function describing a relationship between first vibration generated in one lithography apparatus of two lithography apparatuses among at least three lithography apparatuses, and second vibration generated in the other lithography apparatus upon transmission of the first vibration to the other lithography apparatus, and a calculator which calculates, based on the transfer function, an amount of vibration of a first lithography apparatus among the at least three lithography apparatuses due to vibration of lithography apparatuses, other than the first lithography apparatus, and a controller which controls the lithography apparatuses other than the first lithography apparatus, so that the amount of vibration calculated falls below a tolerance.

12 Claims, 5 Drawing Sheets

(56) References Cited

U.S. PATENT DOCUMENTS

2006/0209283 A1* 9/2006 Nawata .................. 355/53
2008/0114473 A1   5/2008 Heiland

FOREIGN PATENT DOCUMENTS

| JP | 2000120766 A | 4/2000 |
| JP | 2001146812 A | 5/2001 |
| JP | 2003255550 A | 9/2003 |
| JP | 2008153631 A | 7/2008 |
| JP | 2009130355 A | 6/2009 |
| JP | 4358817 B | 11/2009 |
| JP | 2011187584 A | 9/2011 |

OTHER PUBLICATIONS

Japanese Office Action issued in Japanese counterpart application No. JP2011193277, dated Aug. 3, 2015. English translation provided.

* cited by examiner

LITHOGRAPHY SYSTEM AND MANUFACTURING METHOD OF COMMODITIES

BACKGROUND OF THE INVENTION

1. Field of the Invention

The present invention relates to a lithography system and a manufacturing method of commodities.

2. Description of the Related Art

An imprint apparatus cures a resin (imprint material) on a substrate (a silicon wafer or a glass plate) while a mold (original) having a pattern (fine structure) is pressed against the resin, thereby transferring the pattern of the mold onto the substrate, using the imprint technology.

In such a lithography apparatus, alignment between an original and a substrate is of prime importance. When the process rule stipulates a feature size of, for example, 100 nm or less, the range of the error (tolerance) of alignment between an original and a substrate tolerated by a lithography apparatus is about several to several ten nanometers.

Also, a lithography apparatus, especially an imprint apparatus, is required to improve the transfer accuracy and the transfer rate. Compared to an exposure apparatus, an imprint apparatus generally costs less per unit but requires a longer process time (that is, has a lower transfer rate), and therefore has a lower throughput. Hence, in recent years, a stage for positioning (moving) a substrate is speeded up, and a cluster configuration formed by installing a plurality of imprint apparatuses in a semiconductor manufacturing plant is under development.

On the other hand, improvements in transfer rate and transfer accuracy generally have a trade-off relationship. For example, a stage speed-up increases the magnitude of a reaction force generated by a stage, and this vibrates not only an apparatus including the stage but also apparatuses arranged around it. Especially in the cluster configuration, even if one apparatus generates vibration only in a small amount, vibrations (phase and direction components) generated in a plurality of apparatuses are superposed on each other and therefore amplify each other, so the entire floor on which the apparatuses are installed may vibrate.

In bringing a mold into contact with a resin on a substrate (that is, pressing the mold against the resin) in an imprint apparatus, the positional relationship between the original and the substrate is maintained with high accuracy by alignment performed in advance. However, if vibration is transmitted from the floor to the apparatus, the positional relationship between the original and the substrate deviates, thus degrading the transfer accuracy. Although an expensive exposure apparatus can damp vibration, which, if undamped, is transmitted to the outside, using a counter mass to prevent it from being transmitted to any surrounding apparatuses, it is desired to minimize the use of a counter mass in an imprint apparatus advantageous in cost and footprint.

Under the circumstances, Japanese Patent Laid-Open No. 5-234865 proposes a technique of moving stages of two lithography apparatuses in synchronism with each other so as to mutually cancel reaction forces generated by the respective lithography apparatuses. In the technique described in Japanese Patent Laid-Open No. 5-234865, the stages of the respective lithography apparatuses are moved in synchronism with each other so that their acceleration (or deceleration) start time instants coincide with each other, and their impulses of the acceleration times (or deceleration times) and the accelerations (or decelerations) are equal in absolute value and opposite in sign. In this manner, the technique described in Japanese Patent Laid-Open No. 5-234865 employs the technical idea of a counter mass which cancels a force generated by one of two apparatuses by applying an opposite force from the other.

However, upon application of the technique described in Japanese Patent Laid-Open No. 5-234865 to an actual lithography apparatus, when one apparatus stops its operation upon a breakdown or in maintenance, the other apparatus must inevitably stop its operation even if this is possible in practice, because no apparatus which functions as a counter mass is present. This increases the number of apparatuses which must stop their operations in the cluster configuration, thus lowering the overall operating ratio.

Also, to actually set the impulses of the two apparatuses equal, it is necessary to additionally take into account, for example, the number of apparatuses, the positions at which they are installed, and the frequency components of vibration generated in each apparatus. It is therefore very difficult and impractical to set the impulses of the two apparatuses equal so as not to influence other apparatuses.

SUMMARY OF THE INVENTION

The present invention provides a technique advantageous in suppressing degradation in transfer accuracy and improving the operating ratio in a lithography system.

According to one aspect of the present invention, there is provided a lithography system including at least three lithography apparatuses which transfer patterns onto substrates held by substrate stages, the system including an obtaining unit which obtains a transfer function describing a relationship between first vibration generated in one lithography apparatus of two lithography apparatuses among the at least three lithography apparatuses, and second vibration generated in the other lithography apparatus upon transmission of the first vibration to the other lithography apparatus, a calculation unit which calculates, based on the transfer function obtained by the obtaining unit, an amount of vibration of a first lithography apparatus among the at least three lithography apparatuses due to vibration of lithography apparatuses, other than the first lithography apparatus, among the at least three lithography apparatuses, and a control unit which controls the lithography apparatuses other than the first lithography apparatus, so that the amount of vibration calculated by the calculation unit falls below a tolerance.

Further features of the present invention will become apparent from the following description of exemplary embodiments with reference to the attached drawings.

DESCRIPTION OF THE EMBODIMENTS

Preferred embodiments of the present invention will be described below with reference to the accompanying drawings. Note that the same reference numerals denote the same members throughout the drawings, and a repetitive description thereof will not be given.

Figure 1A:
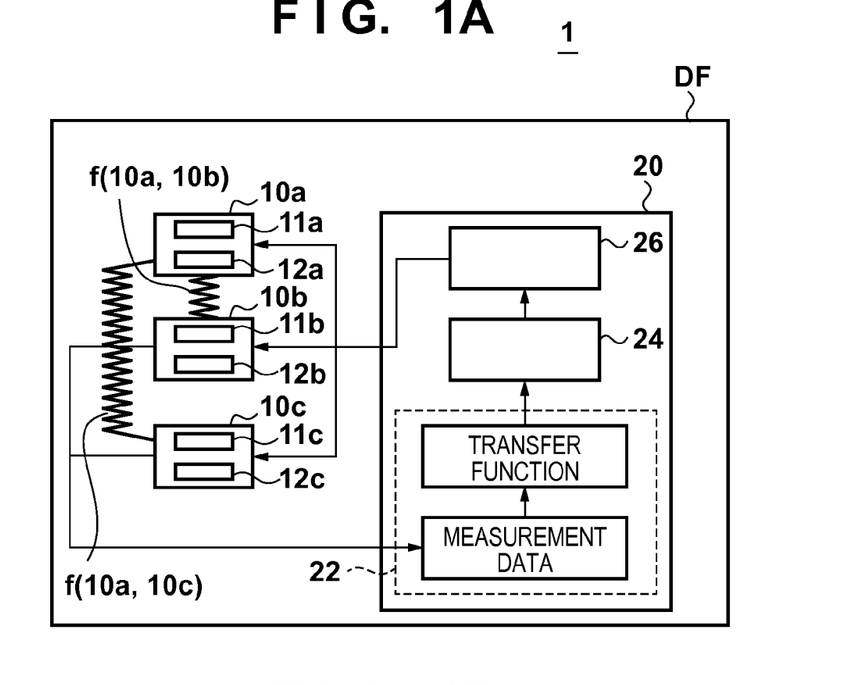
FIGS. 1A and 1B are schematic block diagrams each showing the configuration of a lithography system according to an aspect of the present invention.
Figure 1B:
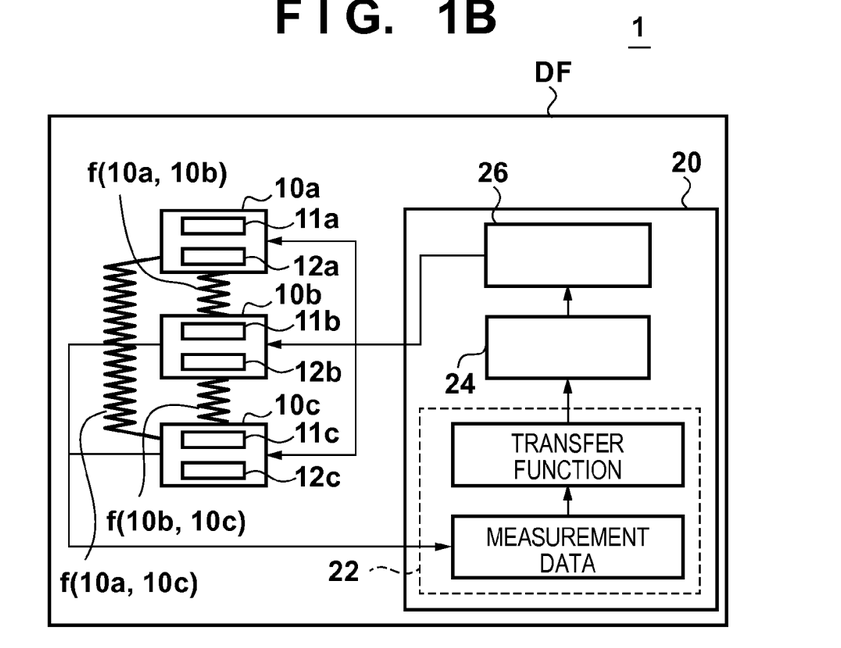

FIGS. 1A and 1B are schematic block diagrams each showing the configuration of a lithography system 1 according to an aspect of the present invention. The lithography system 1 includes lithography apparatuses 10a, 10b, and 10c which transfer patterns onto substrates, and a management unit 20 which manages the lithography apparatuses 10a, 10b, and 10c, as shown in FIGS. 1A and 1B. The lithography apparatuses 10a, 10b, and 10c are installed on a floor DF of a device manufacturing plant, and include substrate stages (movable bodies) 11a, 11b, and 11c, respectively, which move upon holding substrates. The lithography system 1 adopts a cluster configuration, which includes three lithography apparatuses in this embodiment. However, the number of lithography apparatuses is not limited to three, and the lithography system 1 need only include at least three lithography apparatuses.

When the substrate stages 11a, 11b, and 11c move, the floor DF on which the lithography apparatuses 10a, 10b, and 10c are installed vibrates. Hence, measurement units 12a, 12b, and 12c which measure the amounts of vibrations (or physical quantities proportional to these amounts of vibrations) of the lithography apparatuses 10a, 10b, and 10c, respectively, are placed in the lithography apparatuses 10a, 10b, and 10c, respectively. Each of the measurement units 12a, 12b, and 12c includes, for example, an accelerometer, speedometer, displacement gage, and force detector. Each of the measurement units 12a, 12b, and 12c is placed near the substrate stage (that is, the movable body which generates vibration) or a structure supported by an antivibration unit in the corresponding lithography apparatus. Alternatively, each of the measurement units 12a, 12b, and 12c may be placed near the position at which the corresponding lithography apparatus is installed on the floor DF, and is desirably placed near a structure which influences the accuracy of this lithography apparatus.

The management unit 20 includes an obtaining unit 22, calculation unit 24, and control unit 26, and manages the overall lithography system 1. In this embodiment, the obtaining unit 22 obtains a transfer function describing the relationship of vibration between two lithography apparatuses among the three lithography apparatuses 10a, 10b, and 10c, for each combination of two lithography apparatuses. The transfer function describes the relationship between vibration (first vibration) generated in one lithography apparatus upon movement of the substrate stage of this lithography apparatus, and vibration (second vibration) generated in the other lithography apparatus upon transmission of the first vibration to this lithography apparatus. Vibration is generated in each lithography apparatus presumably not only due to movement of the substrate stage but also due to movement of an original stage which holds an original on which a pattern to be transferred onto a substrate is formed. Vibration is also generated in each lithography apparatus presumably due to movement of a mold holding unit which holds a mold, in an imprint apparatus. However, the transfer functions become complicated when vibrations due to various factors are taken into consideration. Hence, if vibrations generated by the substrate stages have a considerable influence, transfer functions can be easily obtained by taking them into consideration alone. The obtaining unit 22 receives, for example, measurement data obtained by the measurement unit 12b upon movement of the substrate stage 11b, and measurement data obtained by the measurement unit 12a upon transmission of vibration due to the movement of the substrate stage 11b to the lithography apparatus 10a. The obtaining unit 22 calculates (obtains) a transfer function f(10a, 10b) having as input and output values the two types of measurement data obtained by the measurement units 12a and 12b, based on the measurement results obtained by the measurement units 12a and 12b. Similarly, the obtaining unit 22 calculates (obtains) a transfer function f(10a, 10c) between the lithography apparatuses 10a and 10c, and a transfer function f(10b, 10c) between the lithography apparatuses 10b and 10c.

The obtaining unit 22 can also obtain transfer functions by simulation based on, for example, information associated with the constituent members of the lithography apparatuses 10a, 10b, and 10c, and information associated with the positions at which the lithography apparatuses 10a, 10b, and 10c are installed. However, in the cluster configuration, the transfer functions vary depending not only on the distances between the lithography apparatuses but also on, for example, the positions of beams which form the floor DF. Hence, it is desired to take into account, for example, information associated with the positions of beams which form the floor DF when transfer functions are obtained by simulation.

In this embodiment, a transfer function in a strict sense can be substituted with a coefficient representing vibration transmission. The coefficient representing vibration transmission means herein a coefficient representing the ratio between the input and output values of vibration at a specific frequency.

The calculation unit 24 calculates the amount of vibration of a first lithography apparatus (for example, the lithography apparatus 10a) due to movement of the substrate stages of the lithography apparatuses other than the first lithography apparatus, based on the transfer functions obtained by the obtaining unit 22. When vibration is generated in, for example, the lithography apparatus 10b or 10c, the calculation unit 24 calculates the amount of vibration transmitted to the lithography apparatus 10a (vibration generated in the lithography apparatus 10a), based on the transfer function f(10a, 10b) or f(10a, 10c).

The control unit 26 controls movement of the substrate stages of the lithography apparatuses other than the first lithography apparatus so that the amount of vibration of the first lithography apparatus, which is calculated by the calculation unit 24, falls below a tolerance (falls below an allowable amount of vibration). The case wherein the three lithography apparatuses 10a to 10c are operated will be considered. In this case, the control unit 26 sets standby times for, for example, the lithography apparatuses 10b and 10c so that the amount of vibration of the lithography apparatus 10a, which is calculated by the calculation unit 24, falls below the tolerance, thereby controlling the acceleration start time instants at which the substrate stages 11b and 11c start their acceleration. In this embodiment, accelerating each substrate stage includes not only accelerating the substrate stage (positive acceleration), but also decelerating the substrate stage (negative acceleration).

In the lithography system 1 which adopts the cluster configuration, the control unit 26 must not only keep the amount of vibration of the lithography apparatus 10a below the tolerance, but also keep those of the lithography apparatuses 10b and 10c below the tolerance. Hence, to control the amounts of vibrations of all the lithography apparatuses to fall below the tolerance, the lithography system 1 is desirably configured to obtain transfer functions for all combinations of two lithography apparatuses, as shown in FIG. 1B. On the other hand, when the amount of vibration of one lithography apparatus (for example, the lithography apparatus 10a) need only be controlled to fall below the tolerance, the lithography system 1 may be configured to obtain only a transfer function necessary to control the amount of vibration of this lithography apparatus, as shown in FIG. 1A.

Figure 2A:
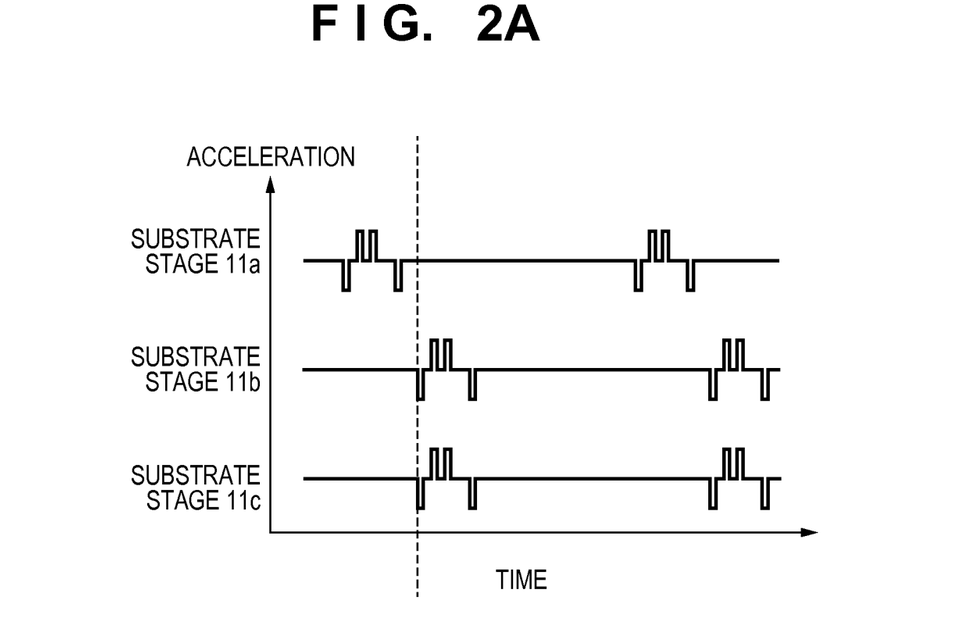
FIG. 2A is a timing chart showing the acceleration profiles of substrate stages.
Figure 2B:
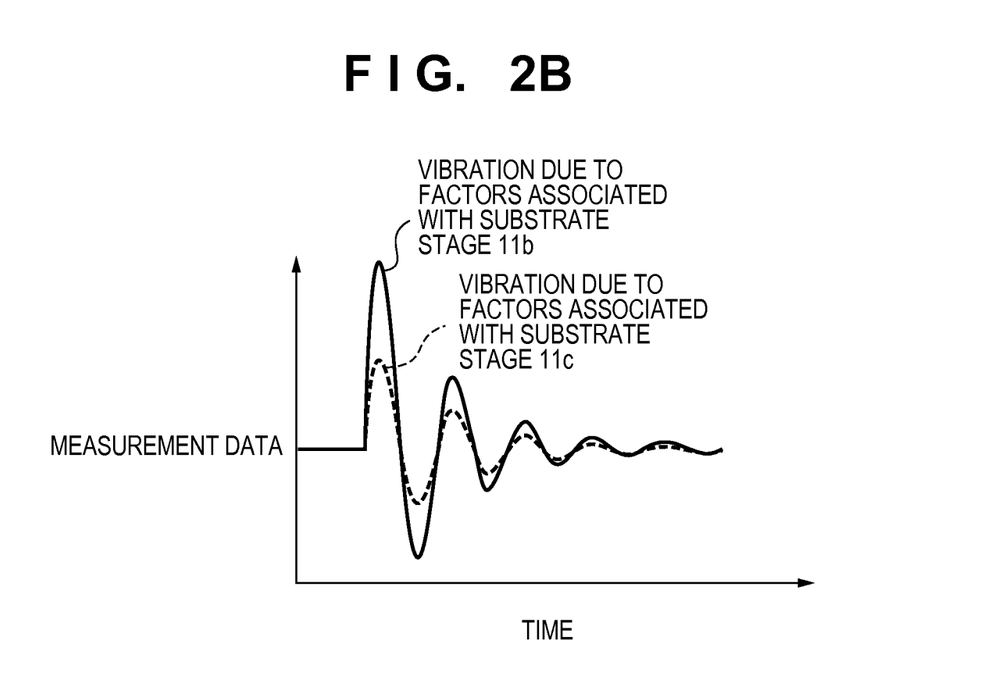
FIG. 2B is a timing chart showing the amounts of vibrations of lithography apparatuses.

FIG. 2A is a timing chart showing in time series the acceleration profiles of the substrate stages 11a, 11b, and 11c, that is, the accelerations of the substrate stages 11a, 11b, and 11c of the lithography apparatuses 10a, 10b, and 10c, respectively. Referring to FIG. 2A, the acceleration period in which the substrate stage 11b accelerates coincides with that in which the substrate stage 11c accelerates. In this case, assuming that it takes the same time for both vibrations due to movement (acceleration) of the substrate stages 11b and 11c to be transmitted to the lithography apparatus 10a, these vibrations are superposed on each other (resonate with each other), as shown in FIG. 2B. When this occurs, the amount of vibration of the lithography apparatus 10a exceeds the tolerance. FIG. 2B is a timing chart showing the amount of vibration of the lithography apparatus 10a due to movement of the substrate stages 11b and 11c (that is, measurement data obtained by the measurement unit 12a).

In this case, vibrations due to movement of the substrate stages 11b and 11c simultaneously reach the lithography apparatus 10a. Vibrations may be transmitted from the lithography apparatuses 10b and 10c to the lithography apparatus 10a in the same amount. However, depending on the types and distances of lithography apparatuses, the magnitudes (amplitudes) of vibrations generated in these lithography apparatuses are not always equal to each other, unlike FIG. 2B. Also, the operation times of the substrate stages 11b and 11c need not always coincide with each other, unlike FIG. 2A. Even if the operations of the substrate stages 11b and 11c are asynchronous, vibrations transmitted from the lithography apparatuses 10b and 10c to the lithography apparatus 10a may be superposed on each other, as shown in FIG. 2B, when it takes different times for them to reach the lithography apparatus 10a. For example, even if the acceleration start time of the substrate stage 11b is later than that of the substrate stage 11c, vibrations generated in the lithography apparatuses 10b and 10c are sometimes superposed on each other when the distance from the lithography apparatus 10a to the lithography apparatus 10b is shorter than that from the lithography apparatus 10a to the lithography apparatus 10c.

Figure 3A:
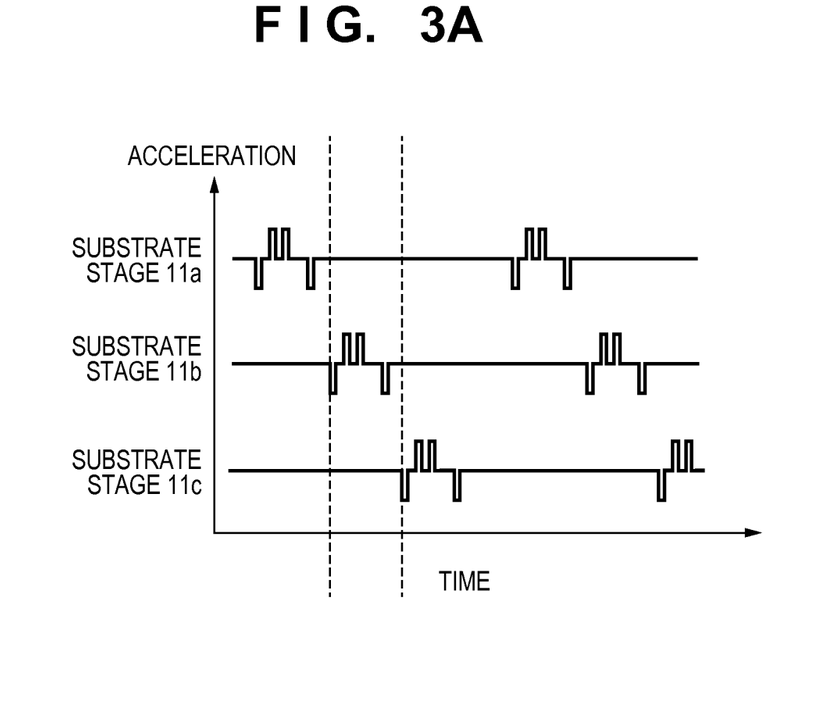
FIG. 3A is a timing chart showing the acceleration profiles of the substrate stages.
Figure 3B:
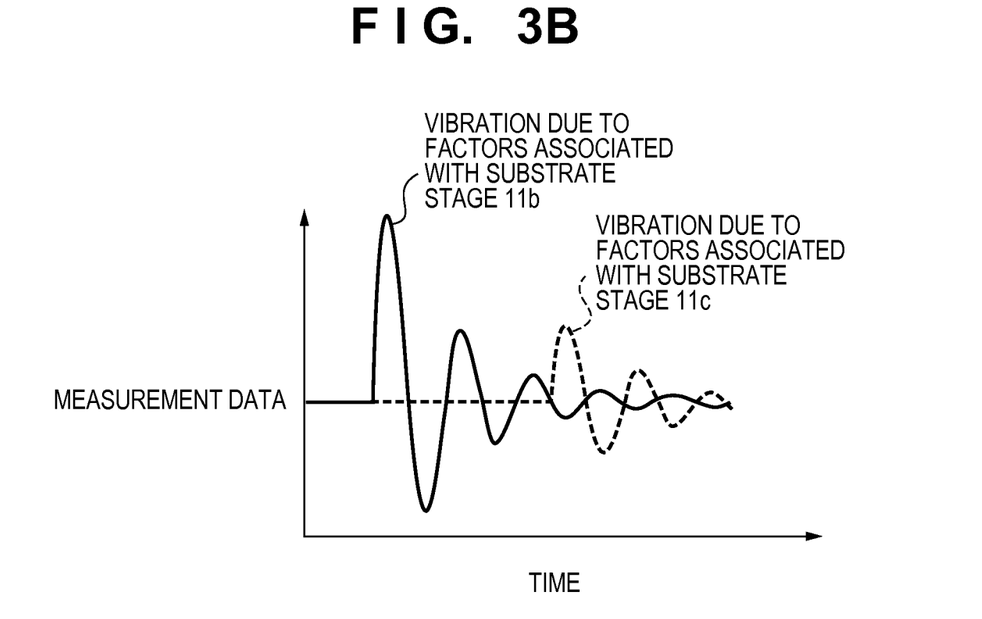
FIG. 3B is a timing chart showing the amounts of vibrations of the lithography apparatuses.

To cope with this situation, when the amount of vibration of the lithography apparatus 10a exceeds the tolerance upon vibrations due to movement of the substrate stages 11b and 11c, the control unit 26 controls at least one of the substrate stages 11b and 11c. For example, assume that the acceleration start times of the substrate stages 11b and 11c coincide with each other, and it takes the same time for both vibrations due to movement (acceleration) of the substrate stages 11b and 11c to reach the lithography apparatus 10a, as shown in FIG. 2A. In this case, the control unit 26 controls the acceleration start time instant at which the substrate stage 11c starts its acceleration, as shown in FIG. 3A. More specifically, the control unit 26 changes the acceleration start time instant, at which the substrate stage 11c starts its acceleration, so that the acceleration period in which the substrate stage 11b accelerates does not coincide with that in which the substrate stage 11c accelerates. In this case, even when vibrations due to movement of the substrate stages 11b and 11c are transmitted to the lithography apparatus 10a, they are not superposed on each other, as shown in FIG. 3B. This makes it possible to keep the amount of vibration of the lithography apparatus 10a below the tolerance. Also, if the operations of the substrate stages 11b and 11c are asynchronous, but nonetheless vibrations due to movement of the substrate stages 11b and 11c are superposed on each other, as shown in FIG. 2B, these vibrations can be prevented from being superposed on each other, as shown in FIG. 3B, by controlling at least one of the substrate stages 11b and 11c. Note that the acceleration start time instant at which the substrate stage 11b starts its acceleration may be changed so that the acceleration period in which the substrate stage 11b accelerates does not coincide with that in which the substrate stage 11c accelerates.

The amount of vibration of the lithography apparatus 10a may be kept below the tolerance by making the control unit 26 control not only the acceleration start time instant of at least one of the substrate stages 11b and 11c but also the acceleration of at least one of the substrate stages 11b and 11c. Referring to FIG. 3B, movement of each substrate stage is controlled without taking into consideration the differences in phase and direction component between the two substrate stages. In practice, it is necessary to control movement of each substrate stage by taking into consideration the differences in phase and direction component between the substrate stages, so as not to amplify vibration in the lithography apparatus 10a.

In this manner, the lithography system 1 in this embodiment can not only keep the amount of vibration of each lithography apparatus below the tolerance, but also operate other lithography apparatuses even if one lithography apparatus stops its operation. Hence, the lithography system 1 can improve the operating ratio while suppressing degradation in transfer accuracy of a pattern transferred onto a substrate.

The control unit 26 can also control the acceleration period in which the substrate stage of each lithography apparatus accelerates. For example, the control unit 26 controls the acceleration period of the substrate stage of a lithography apparatus having a high level of vibration transmission among the lithography apparatuses, thereby suppressing amplification of vibration as the acceleration period of the substrate stage of this lithography apparatus coincides with those of the substrate stages of other lithography apparatuses. On the other hand, the control unit 26 controls the acceleration start time instant of the substrate stage of a lithography apparatus having a low level of vibration transmission among the lithography apparatuses by, for example, shortening the standby time of this lithography apparatus without controlling the acceleration period of the substrate stage too much. This makes it possible to optimize a lithography apparatus to be operated, while keeping the amount of vibration of each lithography apparatus below the tolerance, thus improving the operating ratio of the lithography system.

The amount of vibration tolerated by each lithography apparatus also varies in each individual process step. For example, in a process of transferring a pattern onto a substrate held by a substrate stage, and a process of positioning the substrate held by the substrate stage require high process accuracy, the tolerance of vibration that influences the process accuracy is naturally small. Hence, the control unit 26 may control the substrate stage only in a process step in which the amount of vibration tolerated by the lithography apparatus is small, instead of controlling the substrate stage in all process steps. This makes it possible to further improve the operating ratio of the lithography system 1.

Also, in a lithography system including a large number of lithography apparatuses, vibrations in the respective lithography apparatuses are more likely to be superposed on each other (resonate with each other), so it is relatively easy to obtain effects of, for example, suppressing degradation in transfer accuracy and improving the operating ratio.

Figure 4:
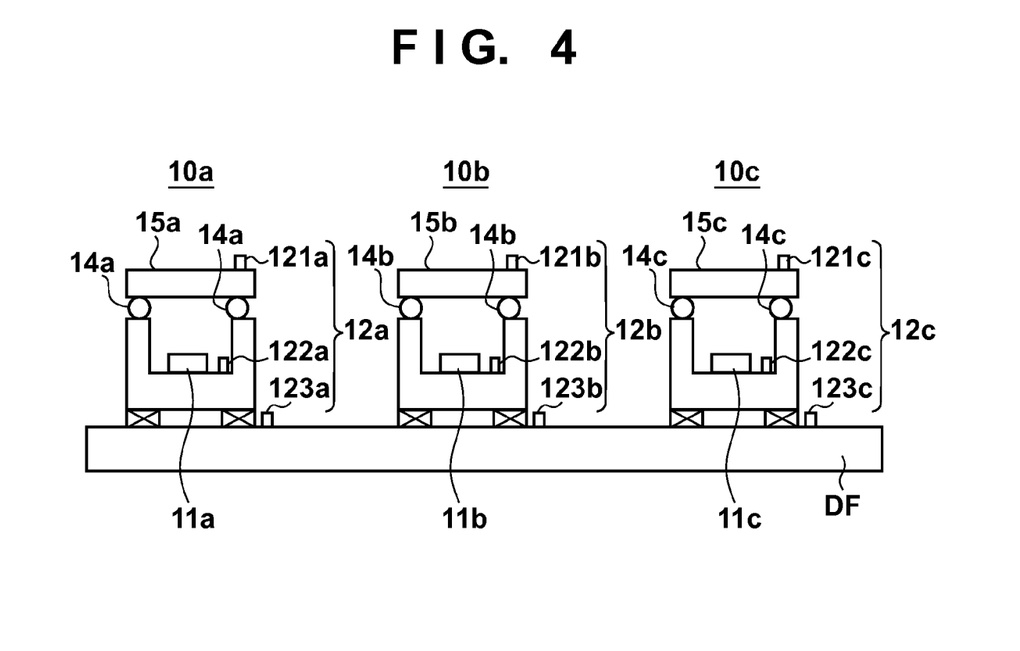
FIG. 4 is a view for explaining details of measurement units arranged in the lithography apparatuses.

The measurement units 12a, 12b, and 12c which measure data (the amounts of vibrations of the respective lithography apparatuses) necessary to obtain transfer functions will be described in more detail with reference to FIG. 4.

The measurement unit 12a includes a measurement device 121a placed on a structure 15a supported by antivibration units 14a, a measurement device 122a placed near the substrate stage 11a, and a measurement device 123a placed near the position at which the lithography apparatus 10a is installed. Similarly, the measurement unit 12b includes a measurement device 121b placed on a structure 15b supported by antivibration units 14b, a measurement device 122b placed near the substrate stage 11b, and a measurement device 123b placed near the position at which the lithography apparatus 10b is installed. Again, the measurement unit 12c includes a measurement device 121c placed on a structure 15c supported by antivibration units 14c, a measurement device 122c placed near the substrate stage 11c, and a measurement device 123c placed near the position at which the lithography apparatus 10c is installed. Each of the measurement devices 121a to 123a, 121b to 123b, and 121c to 123c includes at least one of an accelerometer, speedometer, displacement gauge, and force detector, as described above.

A transfer function describing the relationship between vibrations transmitted between the lithography apparatuses must have input and output values in a one-to-one correspondence. The case wherein, for example, a transfer function having vibration in the lithography apparatus 10b as an input, and vibration in the lithography apparatus 10a as an output will be considered. In this case, measurement data obtained by one of the measurement devices 121b to 123b, and measurement data obtained by one of the measurement devices 121a to 123a are necessary. Also, because the substrate stage 11c must stand still while vibrations in the lithography apparatuses 10a and 10b are measured, it is desired to obtain a transfer function before a device is manufactured. When a transfer function is obtained before a device is manufactured, the amounts of vibrations of the lithography apparatuses 10a and 10b can be measured as long as a sufficient measurement time can be ensured, so the adverse effect that noise exerts on the measurement data can be reduced by averaging the measurement data. The adverse effect that noise exerts on the measurement data can also be reduced by increasing the acceleration of the substrate stage 11b.

Figure 5:
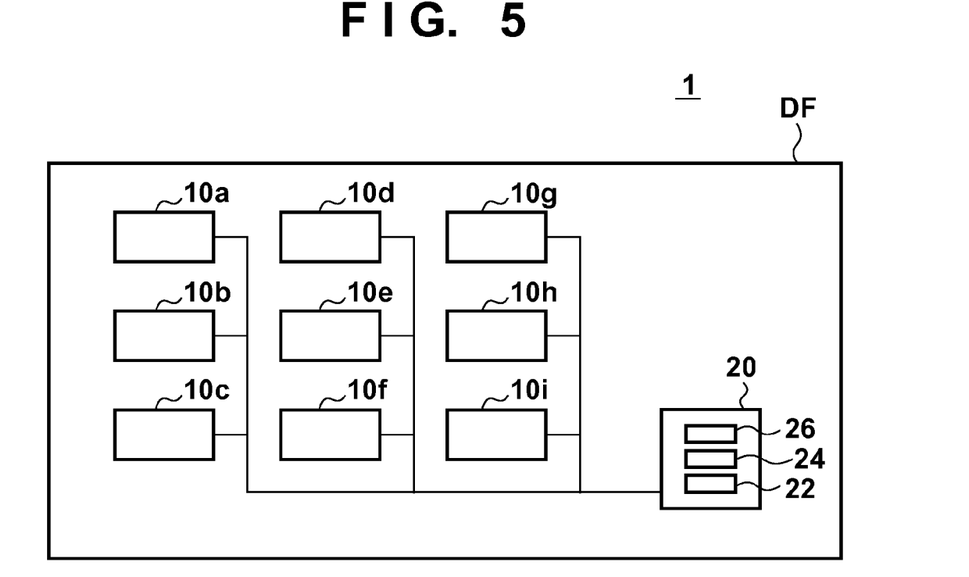
FIG. 5 is a schematic block diagram showing the configuration of a lithography system according to another aspect of the present invention.

The case wherein the lithography system 1 includes three or more lithography apparatuses and, more specifically, nine lithography apparatuses 10a to 10i will be considered with reference to FIG. 5. For example, to operate the lithography apparatuses other than the lithography apparatus 10a during its operation, the control unit 26 (management unit 20) can select a lithography apparatus, to be operated in synchronism with the lithography apparatus 10a, from the lithography apparatuses 10b to 10i. More specifically, the control unit 26 selects a lithography apparatus, that generates vibration in an amount that falls below the tolerance, from the lithography apparatuses 10b to 10i based on the transfer functions obtained by the obtaining unit 22.

Because the lithography apparatuses 10b and 10d are placed near the lithography apparatus 10a, the transfer function between the lithography apparatuses 10a and 10b or 10d is generally large. On the other hand, because the lithography apparatuses 10c and 10g are placed far from the lithography apparatus 10a, the transfer function between the lithography apparatuses 10a and 10c or 10g is generally small. This means that when the lithography apparatuses 10b and 10d are operated in synchronism with the lithography apparatus 10a, it is highly probable that their vibrations amplify each other so that the amount of vibration of the lithography apparatus 10a, 10b, or 10d exceeds the tolerance. To keep the amount of vibration of each lithography apparatus below the tolerance, it is only necessary to reduce the number of lithography apparatuses to be operated in synchronism with the lithography apparatus 10a. However, this considerably lowers the operating ratio of the lithography system 1.

To prevent this problem, the control unit 26 selects the lithography apparatuses 10c and 10g having small transfer functions with respect to the lithography apparatus 10a as a lithography apparatus to be operated in synchronism with the lithography apparatus 10a. In general, when the distance between lithography apparatuses is long, or the rigidity of the floor DF on which these lithography apparatuses are installed is high, vibration transmitted between these lithography apparatuses are damped, so their transfer function becomes small. Therefore, while suppressing amplification of vibration despite the operation of the same number of lithography apparatuses, the amounts of vibrations of the lithography apparatuses 10a, 10c, and 10g can be kept below the tolerance more reliably than those of the lithography apparatuses 10b and 10d when they are operated in synchronism with the lithography apparatus 10a. Also, as described above, amplification of vibration in a lithography apparatus having a high level of vibration transmission can be suppressed by controlling the acceleration period of the substrate stage in this lithography apparatus.

Figure 6A:
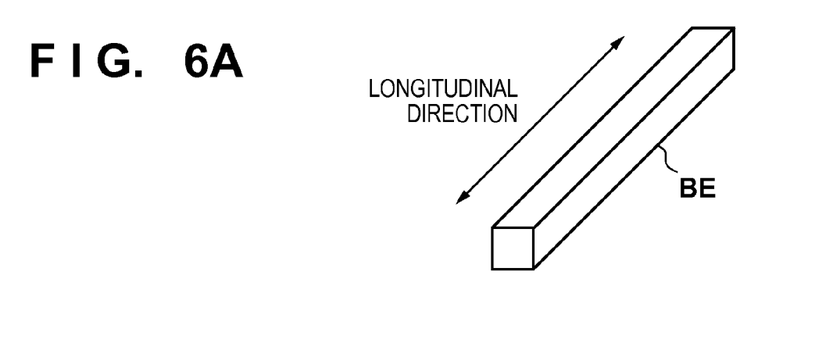
FIGS. 6A to 6C are views for explaining a floor (beams which form it) on which lithography apparatuses are installed.

The transfer function describing the relationship between vibrations transmitted between the lithography apparatuses also depends on the floor DF serving as a vibration transmission path and, more specifically, beams which form the floor DF (their positions), as described above. The floor DF on which the lithography apparatuses are installed is generally implemented by combining a plurality of beams BE shown in FIG. 6A, as shown in FIGS. 6B and 6C.

Figure 6B:
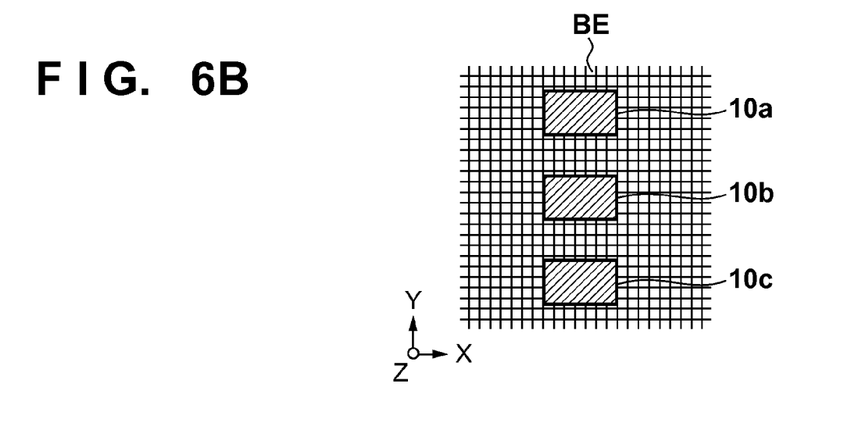

The case wherein the lithography apparatuses 10a, 10b, and 10c are arranged on the beams BE which form the floor DF, as shown in FIG. 6B, will be considered. In this case, vibrations generated as the substrate stages of the lithography apparatuses 10a to 10c move in a direction (Y-direction) parallel to the longitudinal direction of the beams BE can easily be transmitted between the lithography apparatuses. On the other hand, vibrations generated as the substrate stages of the lithography apparatus 10a to 10c move in a direction (X-direction) perpendicular to the longitudinal direction of the beams BE can hardly be transmitted between the lithography apparatuses. This is because the compression strength which acts in the longitudinal direction of the beams BE is larger than the flexural strength which acts in the direction perpendicular to the longitudinal direction of the beams BE, and this makes it hard to damp vibration in the longitudinal direction of the beams BE. Hence, the control unit 26 may control movement of the substrate stage (the acceleration start time instant of the substrate stage) of each lithography apparatus only when the substrate stage moves in a direction parallel to the longitudinal direction of the beams BE.

Figure 6C:
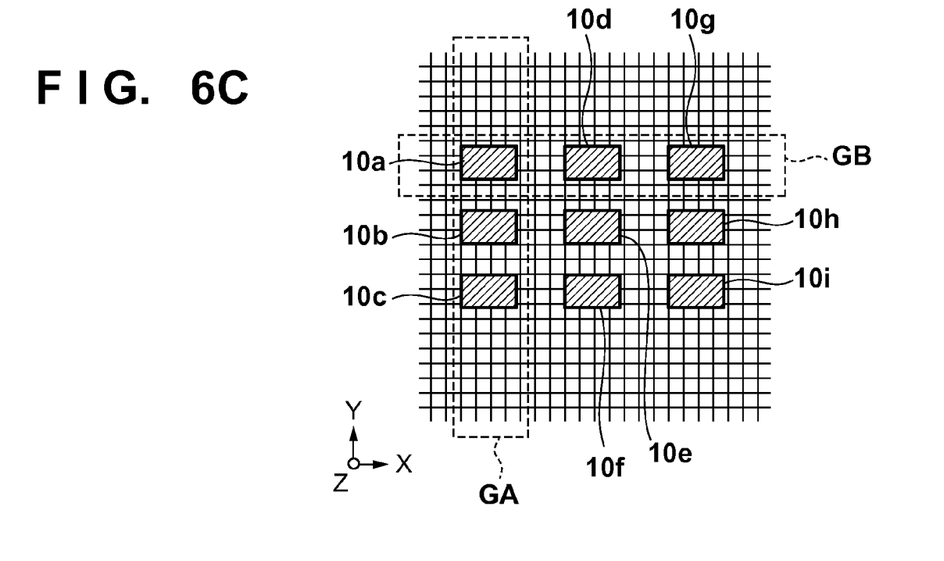

The case wherein a large number of lithography apparatuses 10a to 10i are arranged on the beams BE which form the floor DF, as shown in FIG. 6C, will be considered. In this case, upon obtaining transfer functions for all the lithography apparatuses, the obtaining unit 22 and calculation unit 24 must handle an enormous amount of data (for example, measurement data). Also, control of movement of the substrate stages of all the lithography apparatuses by the control unit 26 is considerably complicated. Hence, the lithography apparatuses 10a to 10i are classified into groups (groups GA and GB) each including lithography apparatuses arranged with the same beam BE, as shown in FIG. 6C. The obtaining unit 22 obtains one transfer function as a representative of all combinations of two lithography apparatuses included in each group. This makes it possible to reduce the amount of data to be handed by the obtaining unit 22 and calculation unit 24, thereby preventing complication of control by the control unit 26.

The case wherein, for example, the lithography apparatus 10a included in the groups GA and GB is operated will be considered with reference to FIG. 6C. In this case, in moving the substrate stage of the lithography apparatus 10a in the X-direction, the control unit 26 controls movement of the substrate stage of the lithography apparatus 10a based on one transfer function as a representative of the transfer functions between the lithography apparatuses 10a, 10d, and 10g. On the other hand, in moving the substrate stage of the lithography apparatus 10a in the Y-direction, the control unit 26 controls movement of the substrate stage of the lithography apparatus 10a based on one transfer function as a representative of the transfer functions between the lithography apparatuses 10a, 10b, and 10c.

Also, two methods of controlling movement of the substrate stage of each lithography apparatus (acceleration start time instant) by the control unit 26 are available. In the first method, the control unit 26 schedules and controls the acceleration start time instant of the substrate stage of each lithography apparatus. When the moving profile of the substrate stage of each lithography apparatus is determined in advance, the amount of vibration of this lithography apparatus can be calculated based on the transfer function between the lithography apparatuses. This makes it possible to schedule the acceleration start time instant (and acceleration period) of the substrate stage of each lithography apparatus so that the amount of vibration of this lithography apparatus falls below the tolerance.

In the second method, the control unit 26 sequentially determines whether to enable movement of the substrate stage of each lithography apparatus (whether to enable the start of acceleration of this substrate stage). The case wherein, for example, the lithography apparatus 10a is operated will be considered with reference to FIG. 5. After operation preparations are completed, the lithography apparatus 10a notifies the control unit 26 to that effect. In response to this notification, the control unit 26 causes the calculation unit 24 to calculate the amounts of vibrations of the lithography apparatuses 10b to 10i other than the lithography apparatus 10a due to movement of the substrate stage of the lithography apparatus 10a, based on the transfer functions obtained by the obtaining unit 22. Also, the control unit 26 causes the calculation unit 24 to calculate the amount of vibration of the lithography apparatus 10a due to movement of the substrate stages of the lithography apparatuses 10b to 10i other than the lithography apparatus 10a, based on the transfer functions obtained by the obtaining unit 22. If all the amounts of vibrations calculated by the calculation unit 24 fall below the tolerance, the control unit 26 enables movement of the substrate stage of the lithography apparatus 10a. Note that if even one of the amounts of vibrations calculated by the calculation unit 24 exceeds the tolerance, the control unit 26 causes the lithography apparatus 10a to stand by, and enables movement of the substrate stage of the lithography apparatus 10a at the timing at which all the amounts of vibrations fall below the tolerance. In this case, the control unit 26 and calculation unit 24 function as a determination unit which sequentially determines, for each lithography apparatus provided in the lithography system 1, whether to enable movement of the substrate stage of this lithography apparatus.

Note that practical examples of the lithography apparatus in this embodiment are an imprint apparatus, a charged particle beam exposure apparatus, and a projection exposure apparatus. The imprint apparatus is a lithography apparatus which cures a resin (imprint material) on a substrate while a mold is kept in contact with the resin, and peels the mold off the cured resin, thereby transferring the pattern of the mold onto the substrate. The charged particle beam exposure apparatus is a lithography apparatus which draws on a substrate using a charged particle beam to transfer a pattern onto the substrate. The projection exposure apparatus is a lithography apparatus which projects and transfers the pattern of a reticle onto a substrate via a projection optical system.

In this manner, the lithography system 1 in this embodiment is advantageous in suppressing degradation in transfer accuracy and improving the operating ratio. Hence, the lithography system 1 can provide high-quality commodities such as a semiconductor device, an LCD device, an image sensing device (for example, a CCD), and a thin-film magnetic head with a high throughput and good economic efficiency. A manufacturing method of devices as commodities includes a step of transferring a pattern onto a substrate (for example, a wafer, a glass plate, or a film-like substrate) using the lithography system 1. This manufacturing method also includes steps of processing the substrate having the pattern formed on it (for example, oxidation, film formation, vapor deposition, doping, planarization, etching, resist removal, dicing, bonding, and packaging).

Although a lithography system which controls a substrate stage (its movement) of each lithography apparatus so that the amount of vibration of this lithography apparatus falls below a tolerance for the entire period has been described in this embodiment, it need not always perform this control for the entire period. The lithography system may control a substrate stage of, for example, each imprint apparatus so that the amount of vibration of this imprint apparatus falls below a tolerance, for the period in which a mold is kept in contact with a resin or that in which alignment is performed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-193277 filed on Sep. 5, 2011, which is hereby incorporated by reference herein in its entirety.

What is claimed is:

1. A lithography system including at least three lithography apparatuses each that form a pattern onto a substrate held by a substrate stage, the system comprising:

a calculation unit that calculates, based on a transfer function, a vibration of a first lithography apparatus, among the at least three lithography apparatuses, due to vibrations of lithography apparatuses other than the first lithography apparatus, among the at least three lithography apparatuses; and a control unit that controls the lithography apparatuses other than the first lithography apparatus, so that the vibration of the first lithography apparatus calculated by the calculation unit falls below a tolerance, wherein the transfer function is a relationship between a first vibration generated in one of two lithography apparatuses, among the at least three lithography apparatuses, and a second vibration generated in the other of the two lithography apparatuses, upon transmission of the first vibration to the other lithography apparatus.

2. The system according to claim 1, wherein the control unit controls the movement of the substrate stage of the first lithography apparatus, and controls the movement, at which each of the substrate stages of the lithography apparatuses other than the first lithography apparatus starts the movement, so that the movement does not coincide with a period in which the substrate stage of the first lithography apparatus moves.

3. The system according to claim 1, wherein the control unit controls the movement of the substrate stage of the first lithography apparatus, and controls the movement, at which each of the substrate stages of the lithography apparatuses other than the first lithography apparatus starts movement, so that the movement does not coincide with a period in which each of the substrate stages of the lithography apparatuses other than the first lithography apparatus moves.

4. The system according to claim 1, wherein the control unit controls the movement of the substrate stage of the first lithography apparatus, and controls accelerations of the substrate stages of the lithography apparatuses other than the first lithography apparatus.

5. The system according to claim 1, wherein:
each of the at least three lithography apparatuses further comprises a measurement unit that measures a vibration of the respective lithography apparatus, and
the transfer function is based on the measurement result obtained by the measurement unit.

6. The system according to claim 1, wherein:
each of the at least three lithography apparatuses is arranged on a plurality of beams, and
in moving the substrate stages of the substrate stages of the lithography apparatuses other than the first lithography apparatus in a direction parallel to a longitudinal direction of the plurality of beams, the control unit controls the movement of the substrate stages of the lithography apparatuses other than the first lithography apparatus.

7. The system according to claim 1, wherein:
each of the at least three lithography apparatuses is arranged on a plurality of beams,
when the at least three lithography apparatuses are classified into groups each including lithography apparatuses arranged on an identical beam among the plurality of beams, and
the transfer function is between two lithography apparatuses among the lithography apparatuses included in each of the classified groups.

8. The system according to claim 1, wherein each of the at least three lithography apparatuses includes an imprint apparatus that forms the pattern of a resin onto the substrate using a mold.

9. The system according to claim 1, wherein each of the at least three lithography apparatuses includes a charged particle beam exposure apparatus that draws on the substrate using a charged particle beam to form the pattern onto the substrate.

10. The system according to claim 1, wherein each of the at least three lithography apparatuses includes an exposure apparatus that projects and forms a pattern of a reticle onto the substrate via a projection optical system.

11. A lithography system including at least three lithography apparatuses each that form a pattern onto a substrate held by a substrate stage, the system comprising:
a determination unit that sequentially determines, for each of the at least three lithography apparatuses, whether to enable movement of the substrate stage of each of the at least three lithography apparatuses,
wherein the determination unit calculates, based on a transfer function, a vibration of each of lithography apparatuses other than a first lithography apparatus, among the at least three lithography apparatuses, due to movement of the substrate stage of the first lithography apparatus, and a vibration of the first lithography apparatus due to movement of the substrate stages of the lithography apparatuses other than the first lithography apparatus, and enables the movement of the substrate stage of the first lithography apparatus when all the calculated vibrations of the at least three lithography apparatuses fall below a tolerance, and
wherein the transfer function is a relationship between a first vibration generated in one of two lithography apparatuses, among the at least three lithography apparatuses, upon movement of the substrate stage of the one lithography apparatus, and a second vibration generated in the other of the two lithography apparatuses, upon transmission of the first vibration to the other lithography apparatus.

12. A manufacturing method of commodities comprising:
a step of using a lithography system to form a pattern onto a substrate; and
a step of processing the substrate with the pattern,
wherein the lithography system includes at least three lithography apparatuses each that form a pattern onto a substrate held by a substrate stage, the lithography system including:
a calculation unit that calculates, based on a transfer function, a vibration of a first lithography apparatus, among the at least three lithography apparatuses, due to vibrations of lithography apparatuses other than the first lithography apparatus, among the at least three lithography apparatuses; and
a control unit that controls the lithography apparatuses other than the first lithography apparatus, so that the vibration of the first lithography apparatus calculated by the calculation unit falls below a tolerance,
wherein the transfer function is a relationship between a first vibration generated in one of two lithography apparatuses, among the at least three lithography apparatuses, and a second vibration generated in the other of the two lithography apparatuses, upon transmission of the first vibration to the other lithography apparatus.

* * * * *